United States Patent
Wong et al.

(10) Patent No.: US 9,337,167 B2
(45) Date of Patent: May 10, 2016

(54) WIRE BONDING METHOD EMPLOYING TWO SCRUB SETTINGS

(71) Applicants: Boh Kid Wong, Ipoh (MY); Cheng Choi Yong, Puchong (MY)

(72) Inventors: Boh Kid Wong, Ipoh (MY); Cheng Choi Yong, Puchong (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/552,472

(22) Filed: Nov. 24, 2014

(65) Prior Publication Data

US 2015/0279810 A1    Oct. 1, 2015

(30) Foreign Application Priority Data

Mar. 28, 2014 (MY) .......................... P12014700776

(51) Int. Cl.
*H01L 21/00* (2006.01)
*H01L 23/00* (2006.01)
*H01L 23/495* (2006.01)

(52) U.S. Cl.
CPC ................ *H01L 24/85* (2013.01); *H01L 24/43* (2013.01); *H01L 24/49* (2013.01); *H01L 23/4952* (2013.01); *H01L 23/49541* (2013.01); *H01L 24/48* (2013.01); *H01L 2224/05624* (2013.01); *H01L 2224/43985* (2013.01); *H01L 2224/45015* (2013.01); *H01L 2224/45144* (2013.01); *H01L 2224/45147* (2013.01); *H01L 2224/85205* (2013.01); *H01L 2224/85345* (2013.01); *H01L 2224/85399* (2013.01); *H01L 2924/00014* (2013.01); *H01L 2924/01013* (2013.01); *H01L 2924/01029* (2013.01); *H01L 2924/386* (2013.01)

(58) Field of Classification Search
CPC ............ H01L 2224/43985; H01L 2224/85205; H01L 2224/85345; H01L 2224/45144; H01L 2224/45147; H01L 24/85; H01L 24/49; H01L 24/43; H01L 23/49541; H01L 23/4952
See application file for complete search history.

(56) References Cited

U.S. PATENT DOCUMENTS 5,364,009 A * 11/1994 Takahashi ............ B23K 20/005
                                                          228/110.1
6,800,555 B2   10/2004 Test
7,326,640 B2    2/2008 Aoh
8,292,160 B2   10/2012 Maruya
(Continued)

OTHER PUBLICATIONS

Norhanani Binte Jaafar et al., "Fine Pitch Copper Wire Bonding Process Optimization with 33 um Size Ball Bond", 13th IEEE Electronics Packaging Technology Conference, 2011, pp. 758-763.

(Continued)

*Primary Examiner* — Shaun Campbell
(74) *Attorney, Agent, or Firm* — Charles E. Bergere

(57) ABSTRACT

A method of attaching bond wires to bond pads on an active surface of a semiconductor die, where the bond pads are disposed along four side edges of the die, and have aluminum top layers. The method includes attaching first bond wires to first bond pads on first and second opposing sides of the die using a first group of settings and attaching second bond wires to the bond pads on third and fourth sides of the die that oppose each other and are adjacent the first and second sides, using a second group of settings. The first and second groups of settings include first and second scrub settings that are different from each other. Employing two separate scrub settings allows for reduced splashing of the aluminum cap layer on the die pad from splashing onto passivation edges of the bond pads.

14 Claims, 2 Drawing Sheets

(56) References Cited

U.S. PATENT DOCUMENTS

| | | | | |
|---|---|---|---|---|
| 8,569,163 | B2 * | 10/2013 | Sekihara | H01L 23/3114 257/784 |
| 2008/0265385 | A1 | 10/2008 | Tsai | |
| 2011/0315743 | A1 * | 12/2011 | Maruya | B23K 20/007 228/102 |
| 2012/0164795 | A1 * | 6/2012 | Sekihara | H01L 23/3114 438/123 |

OTHER PUBLICATIONS

Shinkawa, "Introduction to Cu Wire Bonding Technique", Shinkawa Ltd., http://www.shinkawa.com/en/technology/pdf/cuwire.pdf.

Luu T. Nguyen, David McDonald, Ansel R. Danker and Peter Ng, "Optimization of Copper Wire Bonding on Al—Cu Metalization", IEEE Transactions on Components, Packaging and Manufacturing Technology—Part A, vol. 18, No. 2, Jun. 1995.

* cited by examiner

WIRE BONDING METHOD EMPLOYING TWO SCRUB SETTINGS

BACKGROUND OF THE INVENTION

The present invention relates to semiconductor device assembly and, more particularly, to a method of attaching a bond wire to a bond pad of an integrated circuit die.

Many semiconductor devices use bond wires for connecting bond pads of an integrated circuit die to leads of a lead frame or pads of a substrate. As integrated circuits have become smaller and include more functionality, they also include more input and output pads on the surface of the die and thus, the die bond pads have become smaller in size. In addition, there has been a push to switch from gold bond wires to copper bond wires because copper is less expensive and has better electrical characteristics. However, copper also is stiffer so presents difficulties for fine pitch wire bonding.

One issue that arises when attaching a copper wire to a bond pad is known as aluminum splash. For a bond pad that has a layer of conductive metal such as copper that is covered with a cap layer typically of aluminum to prevent the conductive metal from oxidizing, and a layer of passivation that defines a bond pad opening, when the copper wire is bonded to the bond pad using, for example, ultrasonic bonding, the rubbing of the copper wire against the aluminum cap layer heats the aluminum and causes it to splash. If the aluminum splashes outside of the bond pad opening, such as onto to the passivation layer, it can compromise the bond and possibly cause a short circuit with an adjacent bond pad. This aluminum splash issue is exacerbated as the size of the bond pad opening decreases. Thus, it would be advantageous to be able to attach a copper bond wire to a bond pad having an aluminum cap layer and a very small bond pad opening without excessive aluminum splash.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
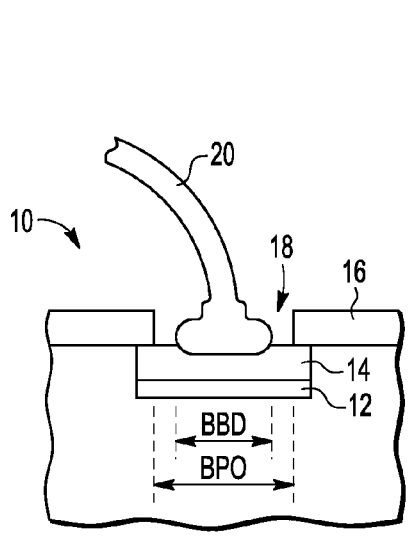
FIG. 1 is an enlarged partial side cross-sectional view of a bond pad with a bond wire attached thereto.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

In one embodiment, the present invention provides a method of attaching bond wires to the bond pads of an integrated circuit die, where the integrated circuit die is rectangular and has an active surface with first bond pads located on first and second opposing sides of the die, and second bond pads located on third and fourth opposing sides of the die, where the third and fourth sides, respectively are adjacent to the first and second sides. The method includes attaching first bond wires to the first bond pads using a first group of settings, and attaching second bond wires to the second bond pads using a second group of settings that is different from the first group of settings. The attaching includes (i) forming a free air ball (FAB) on a tip of the first or second bond wires while the first or second bond wires are held in a capillary, (ii) touching the FAB to a surface of the respective first or second bond pads, (iii) moving the capillary and therefore the FAB against the first or second respective bond pad surface, and (iv) performing a table scrubbing simultaneously with the moving of the capillary. The moving of the capillary comprises performing an ultrasonic bonding process in which the capillary moves back and forth in the Y-direction and the table scrubbing is performed in the X-direction. Different table scrubbing settings are used for bonding the first and second bond wires to the first and second bond pads, but the first and second scrubbings are performed only in the X-direction.

In another embodiment, the present invention provides a semiconductor device having a die flag and an integrated circuit die attached to a top surface of the die flag. The die is rectangular in shape and has an active surface with rectangular shaped bond pads disposed along the four sides of the active surface, where first bond pads are located on first and second opposing sides of the die, and second bond pads are located on third and fourth opposing sides of the die, where the third and fourth sides, respectively are adjacent to the first and second sides. The bond pads have a top or cap layer of aluminum. Lead frame leads are spaced from and surround the die flag. First bond wires extend from the first bond pads to respective ones of the lead frame leads for electrically connecting the first bond pads with the respective ones of the leads. The first bond wires are attached to the first bond pads using a first group of settings. Second bond wires extend from the second bond pads to respective other ones of the lead frame leads for electrically connecting the second bond pads with the other ones of the leads, where the second bond wires are attached to the second bond pads using a second group of settings different from the first group of settings.

Referring now to FIG. 1, a cross-sectional side view of an integrated circuit bond pad 10 is shown. The bond pad 10 comprises a layer of conductive metal 12, which typically is copper, a cap layer 14 typically of aluminum to prevent the conductive metal 12 from oxidizing, and a layer of passivation 16 that defines a bond pad opening 18. This bond pad structure is known by those of skill in the art. In one embodiment of the present invention, the bond pad 10 has a bond pad opening of 43 um or less.

A bond wire 20 having a free air ball (FAB) formed on its end is attached to the bond pad 10. More specifically, in a conventional copper wire bonding process, a FAB is formed at the end of the bond wire 20. The FAB is then moved into the bond pad opening 18 and pressed into contact with the cap layer 14. An ultrasonic bonding process is performed in which the capillary holding the FAB is vibrated, which rubs the FAB against the cap layer 14 and forms a ball bond. The ultrasonic movement of the capillary is in the Y-direction.

In accordance with the present invention, during the ultrasonic bonding process, or as part of the ultrasonic bonding process, a table scrubbing process is performed. In the table scrubbing process, the table upon which the die is held is moved back and forth in the X-direction. After the ball bond is formed and the wire 20 is thus attached to the bond pad 10, the wire 20 is then pulled and moved to the next bonding surface, such as a lead of a lead frame.

As previously discussed, when the FAB is being attached to the bond pad 10, the movement of the FAB against the aluminum cap layer 14 heats the aluminum, which causes the aluminum to splash. According to the present invention, as described below, the amount of aluminum splash is managed by performing the table scrubbing process with settings that depend on which bond pad the wire is being attached so that the chance of any of the aluminum splashing onto the passivation layer 16 is reduced or eliminated.

Figure 2:
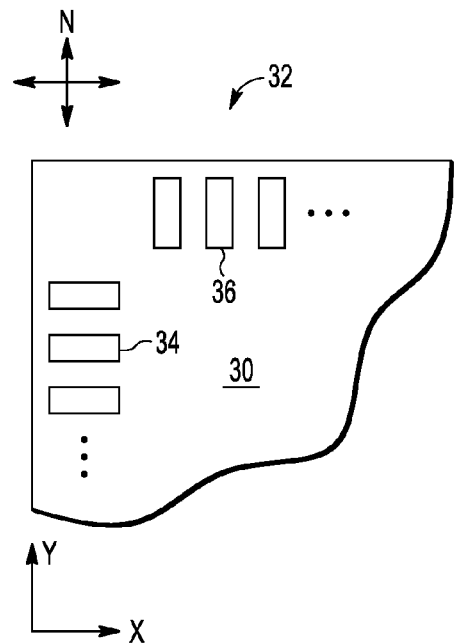
FIG. 2 is an enlarged top plan view of a portion of a semiconductor die.

FIG. 2 is a top plan view of a portion of an active surface 30 of a semiconductor die 32. The die 32 is square or rectangular in shape and thus has four sides. Co-ordinate systems will be used to describe the die orientation and the invention, including directional co-ordinates North (N), South (S), East (E) and West (W), as well as the Cartesian co-ordinates X and Y. Thus, as shown in FIG. 2, the semiconductor die 32 has first bond pads 34 located along the West and East sides (first and second opposing sides), and second bond pads 36 located along the North and South sides (third and fourth opposing sides). The first and second bond pads 34 and 36 are essentially like the bond pad 10 shown in FIG. 1. However, as can be seen in FIG. 2, the first bond pads 34 have a length that runs from West to East, while the second bond pads 36 have a length that runs from North to South. Thus, the first bond pads 34 extend in the X-direction while the second bond pads 36 extend in the Y-direction. Since the capillary movement during wire bonding is in the Y-direction, the ultrasonic bonding process causes aluminum splash in the Y-direction. Then, if the table scrubbing is performed in the X-direction, then table scrubbing causes splashing in the X-direction.

Figure 3A:
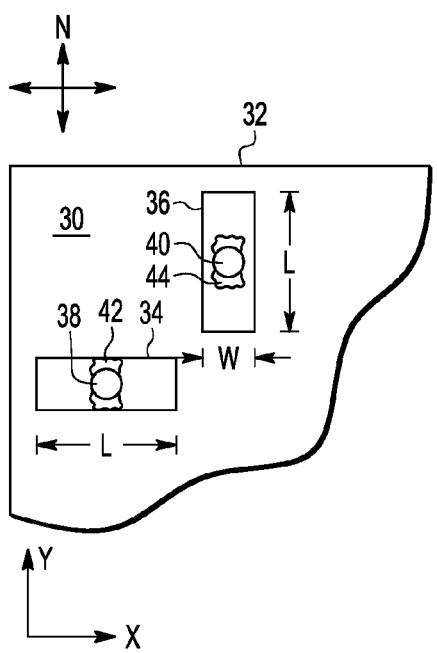
FIG. 3A is a greatly enlarged top plan view of two bond pads on adjacent sides of the semiconductor die of FIG. 2 illustrating aluminum splash.

FIG. 3A is an enlarged view of the active surface 30 of the die 32 showing one each of the first and second bond pads 34 and 36. Outlines of bonded balls 38 and 40 are shown on the first and second bond pads 34 and 36, respectively, where the bonded balls 38 and 40 have been formed using a conventional, ultrasonic wire bonding process. In the conventional process, a bond wire is pressed against the cap layer 14 of the bond pad 34 or 36 and an ultrasonic bonding operation is performed. In the ultrasonic bonding process, the capillary holding the bond wire is moved rapidly back and forth in the Y-direction. The pressure of the wire against the cap layer 14 heats the aluminum and causes the aluminum to splash. Since the movement of the wire is in the Y-direction, the aluminum splash also is in the Y-direction. Aluminum splash 42 is shown surrounding the bonded ball 38 on the bond pad 34, and aluminum splash 44 is shown surrounding the bonded ball 40 on the bond pad 36.

For the second bond pad 36 (on the North or South side), since the movement of the capillary is in the Y-direction, the aluminum splash is in the Y-direction but since the pad 36 extends in the Y-direction, it is unlikely that the aluminum splash 44 will extend onto the passivation layer 16. However, the splash in the X-direction must be limited.

For the first bond pad 34 (on the East or West side), the pad extends in the X-direction so excessive aluminum splash in the Y-direction caused by movement of the capillary in the Y-direction, may extend onto the passivation layer 16. On the other hand, the bond pads on the East and West sides allow maximum splash in the X-direction.

For example, if the bond pad 34 has a bond pad opening (BPO) of 43 um and the bonded ball 38 has an average diameter (BBD) of 35 um, then the Y-direction aluminum splash may be a maximum of 4 um per side, so the combined measurement (BBD+splash) is 43 um (35 um+4 um+4 um) in the Y-direction. Thus, any shift in the ball placement off the center of the BPO will result in a bond with aluminum splash that extends outside of the passivation layer. A shift in placement can be caused by thermal expansion of the die, thermal expansion of the transducer, wire tail not straight after second bond, FAB shape, machine placement resolution, etc. Thus, it would be advantageous to be able to bond a bare copper wire or a coated copper wire to a bond pad without excessive aluminum splash in any one direction, especially the Y-direction.

Accordingly, the present invention provides a method of a attaching a bond wire to a pad of a semiconductor die with little or a reduced amount of aluminum splash, especially in the Y-direction. The present invention aids in reducing yield loss due to aluminum splash extending outside of the bond pad opening or such that any aluminum touches the passivation edge of the bond pad. The present invention is particularly useful for pads having an opening of 43 um or less.

According to the present invention, during wire bonding, two different scrub settings are used. A first group of scrub settings is used for the bond pads on the West and East sides of the die pad, which have less tolerance for splash in the Y-direction and more tolerance for splash in the X-direction, and a second group of scrub settings is used for the bond pads on the North and South sides of the die pad, which can tolerate more splash in the Y-direction but less splash in the X-direction.

Figure 3B:
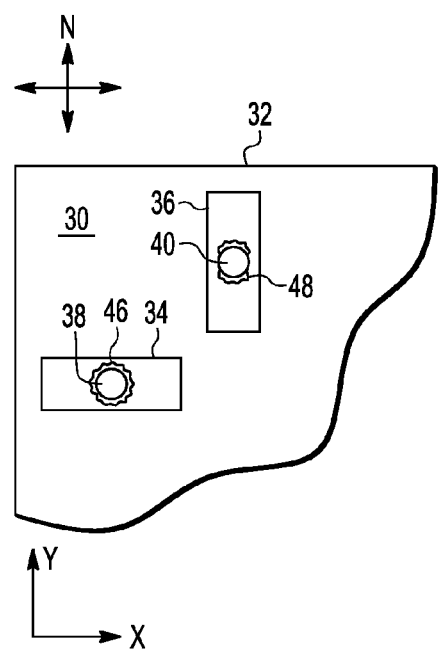
FIG. 3B is a greatly enlarged top plan view of two bond pads on adjacent sides of a semiconductor die illustrating aluminum splash in accordance with an embodiment of the present invention.

Like FIG. 3A, FIG. 3B shows a greatly enlarged top plan view of first and second bond pads 34 and 36 on adjacent sides of a semiconductor die 32 illustrating aluminum splash in accordance with an embodiment of the present invention. The first bond pad 34, which is on the West side of the die 32, has a length that extends in the Y-direction, and the second bond pad 36, which is on the North side of the die 32, has a length that extends in the X-direction. In the example shown, the first and second bond pads 34 and 36 are rectangular and their lengths exceed their widths.

The first bond pad 34 has a bonded ball 38 and a reduced and more uniform amount of aluminum splash 46, while the second bond pad 36 has a bonded ball 40 surrounded by aluminum splash 48. In embodiments of the invention, the bonded balls 38 and 40 are formed from a copper, plated copper, or coated copper wire.

Figure 4:
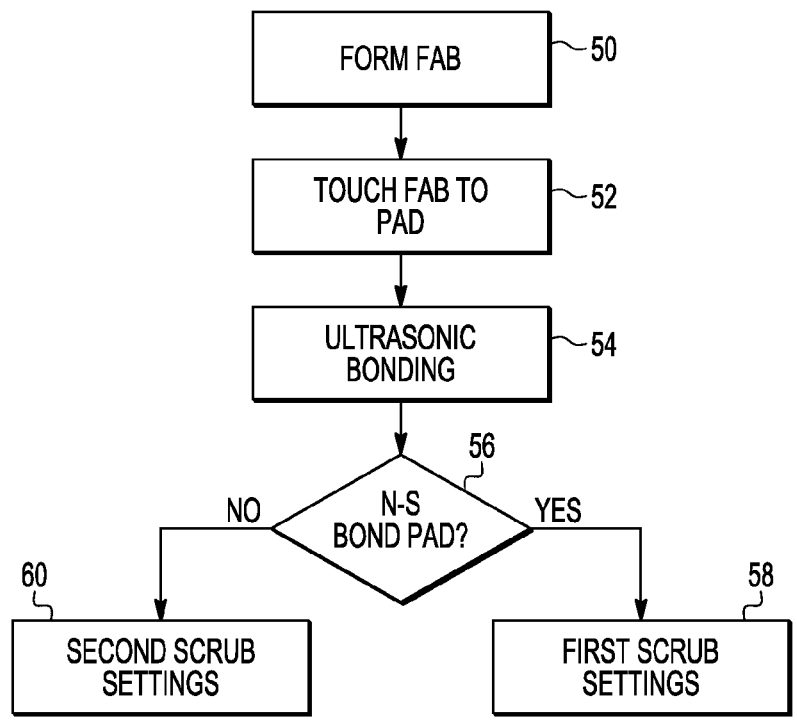
FIG. 4 is flow chart of a method for attaching a bond wire to a bond pad of an integrated circuit in accordance with an embodiment of the present invention.

FIG. 4 is a flow chart illustrating a method of forming wire bonds in accordance with the present invention. In a first step 50, a free air ball (FAB) is formed on a tip of a bond wire while the bond wire is held in a capillary. At step 52, the FAB is touched to a surface of a bond pad, i.e., one of the first or second bond pads 34, 36. At step 54, an ultrasonic bonding process is performed in which the capillary and therefore the FAB is moved against the first or second respective bond pad surface, in the Y-direction. Then, according to the present invention, substantially simultaneously with performing step 54, a table scrubbing process is performed in which the table is moved back and forth in the X-direction but different scrub settings are used depending on whether the bond pad is on the North or South sides of the die versus on the East or West sides of the die.

As previously discussed, the bond pads 36 on the North and South sides of the die 32 can tolerate more aluminum splash in the Y-direction than the bond pads 34 on the East and West sides of the die 32. Therefore, according to the present invention, the table scrubbing, which is set to be only in the X-direction, is performed using different settings. Thus, at step 56, it is determined whether the bond pad to which the wire is being bonded is located on the North or South side of the die. If yes, then first scrub settings as shown at step 58 are used. On the other hand, if the bond pad is not on the North or South sides of the die 32, then second scrub settings are used as shown at step 60.

In a preferred embodiment of the present invention, the table scrub is performed only in the X-direction and the following table scrub settings are used.

|             | N—S bond pads | E—W bond pads |
|-------------|---------------|---------------|
| Amplitude   | 8             | 12            |
| Power/Force | 12/5          | 25/18         |

As can be seen, the amplitude for the E-W bond pads is greater than the amplitude setting for the N-S bond pads. The power and force settings also are greater for the E-W bond pads than for the N-S bond pads, with the power being about two times that of the N-S bond pads for the E-W bond pads, and the force setting for the E-W bond pads is about three times greater than that for the N-S bond pads. Using the above or similar values, the amount of aluminum splash in the X-direction on the N-S bond pads is reduced. The above-described process for forming the bonded balls 38 and 40 may be performed using known wire bonding equipment, such as a Kulicke & Soffa Iconn ProCu copper wire bonder. In one embodiment, wires having a diameter of 20 um were attached to bond pads having a bond pad opening of 43 um using the above scrub settings.

Figure 5:
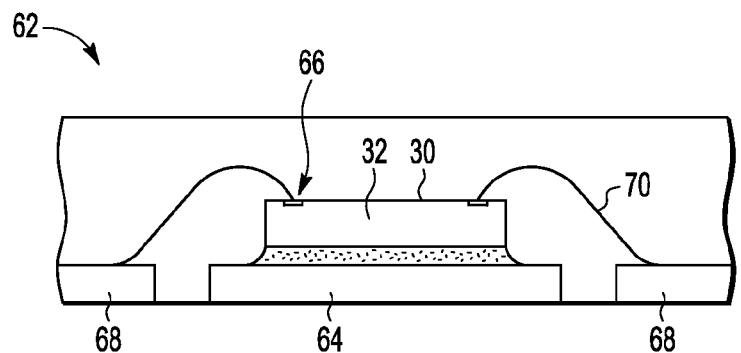
FIG. 5 is an enlarged, cross-sectional side view of a semiconductor device assembled in accordance with an embodiment of the present invention.

Referring now to FIG. 5, an enlarged, cross-sectional side view of a semiconductor device 62 in accordance with an embodiment of the present invention is shown. The semiconductor device 62 includes a die flag 64 and an integrated circuit die 32 attached to a top surface of the die flag 64. The die 32 is rectangular and has an active surface 30 with rectangular bond pads 66 disposed along the four sides of the active surface 30. More particularly, the die 32 has first bond pads located on first and second opposing sides of the die 32 and second bond pads located on third and fourth opposing sides of the die. The third and fourth sides, respectively are adjacent to the first and second sides of the die 32. In one embodiment, the first bond pads have a length that extends in the Y-direction and the second bond pads have a length that extends in the X-direction, and the first and second bond pads have lengths greater than their widths (like the bond pads 34 and 36 shown in FIG. 3B. Like the bond pad 10 shown in FIG. 1, the first and second bond pads have a top layer of aluminum. And in one embodiment, the first and second bond pads have bond pad openings of 43 um or less.

The semiconductor device 62 also has lead frame leads 68 that are spaced from and surround the die flag 64. First bond wires 70 extend from the first bond pads 66 to respective ones of the lead frame leads 68 for electrically connecting the first bond pads 66 with the respective ones of the leads 68. The first bond wires 70 are attached to the first bond pads 66 using a first group of settings. There also are second bond wires (not visible in this view) extending from the second bond pads to respective other ones of the lead frame leads for electrically connecting the second bond pads with the other ones of the leads. The second bond wires are attached to the second bond pads using a second group of settings different from the first group of settings. In one embodiment, the first and second wires are bare copper and in another embodiment the first and second bond wires comprise coated or insulated copper wires. In yet another embodiment, the first and second bond wires comprises plated wires, such as copper wires with a plating layer of Palladium.

The first bond wires 66 are attached to the first bond pads (on the North and South sides of the die) using an ultrasonic wire bonding process and a simultaneous table scrubbing process using a first group of settings, while the second wires are attached to the second bond pads (on East and West sides of the die) using an ultrasonic wire bonding process and table scrubbing process having a second group of settings. The first and second groups of settings specify the amplitude of the movement in the X-direction of the table. In one embodiment, the first group of settings specify performing a first table scrubbing operation at a first X-direction amplitude, and the second group of settings specify performing a second table scrubbing at a second X-direction amplitude that is greater than the first X-direction amplitude. By using the different groups of scrub settings, the aluminum splash on the first and second bond pads is substantially uniform. That is, the splash extends a uniform distance around the bonded ball.

Thus, while the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

The invention claimed is:

1. A method of attaching bond wires to bond pads of an integrated circuit die, wherein the integrated circuit die is rectangular and has an active surface with first bond pads located on first and second opposing sides of the die, and second bond pads located on third and fourth opposing sides of the die, wherein the third and fourth sides, respectively are adjacent to the first and second sides and extend in a first direction, and the first and second sides extend in a second direction that is perpendicular to the first direction, the method comprising:
   attaching first bond wires to the first bond pads using a first group of settings; and
   attaching second bond wires to the second bond pads using a second group of settings that is different from the first group of settings, wherein attaching comprises:
      forming a free air ball (FAB) on a tip of the first or second bond wires while the first or second bond wires are held in a capillary;
      touching the FAB to a surface of the respective first or second bond pads;
      moving the capillary back and forth in the first direction and therefore the FAB against the first or second respective bond pad surface; and
      performing a table scrubbing process simultaneously in the second direction with the moving of the capillary.

2. The method of claim 1, wherein moving the capillary back and forth in the first direction comprises performing an ultrasonic bonding process.

3. The method of claim 1, wherein in the first group of settings, the table scrubbing in the second direction is set at a first value and in the second group of settings the table scrubbing in the second direction is set at a second value that is greater than the first value.

4. The method of claim 1, wherein the first group of settings includes a first table scrub setting and the second group of settings includes a second table scrub setting different from the first table scrub setting.

5. The method of claim 4, wherein the first and second groups of scrub settings include settings for power, force and amplitude.

6. The method of claim 5, wherein the power setting for the second group of scrub settings is greater than the power setting for the second group of scrub settings.

7. The method of claim 6, wherein the power setting for the second group of scrub settings is twice that of the power setting for the second group of scrub settings.

8. The method of claim 5, wherein the force setting for the second group of scrub settings is greater than the force setting of the second group of scrub settings.

9. The method of claim 8, wherein the force setting for the second group of scrub settings is three times the force setting of the second group of scrub settings.

10. The method of claim 5, wherein the amplitude setting for the second group of scrub settings is greater than the amplitude setting of the second group of scrub settings.

11. The method of claim 1, wherein the bond pads have a top layer of aluminum.

12. The method of claim 11, wherein the bond wires comprise copper.

13. The method of claim 1, wherein the bond pads have a bond pad opening of 43 um or less.

14. The method of claim 1, wherein the table scrubbing process is performed by moving a table that has the integrated circuit die held thereupon back and forth.

* * * * *